(12) United States Patent
Lee et al.

(10) Patent No.: US 6,475,827 B1
(45) Date of Patent: Nov. 5, 2002

(54) METHOD FOR MAKING A SEMICONDUCTOR PACKAGE HAVING IMPROVED DEFECT TESTING AND INCREASED PRODUCTION YIELD

(75) Inventors: Tae Heon Lee, Kyunggi-do (KR); Mu Hwan Seo, Aspen Heights (SG)

(73) Assignee: Amkor Technology, Inc., Chandler, AZ (US)

( * ) Notice: Subject to any disclaimer, the term of this patent is extended or adjusted under 35 U.S.C. 154(b) by 19 days.

(21) Appl. No.: 09/687,532

(22) Filed: Oct. 13, 2000

(Under 37 CFR 1.47)

(30) Foreign Application Priority Data

Oct. 15, 1999 (KR) .............................. 99-44662

(51) Int. Cl.[7] .............................................. H01L 21/44
(52) U.S. Cl. ...................................................... 438/106
(58) Field of Search ................................ 257/670, 666; 438/14, 678, 650, 106, 110, 123

(56) References Cited

U.S. PATENT DOCUMENTS 4,530,152 A * 7/1985 Roche et al. .................. 29/588

(List continued on next page.)

FOREIGN PATENT DOCUMENTS

| JP | 57-45959 | | 3/1982 |
|---|---|---|---|
| JP | 58-101317 | | 6/1983 |
| JP | 58-160095 | | 9/1983 |
| JP | 61-39555 | | 2/1986 |
| JP | 62-9639 | | 1/1987 |
| JP | 63-205935 | | 8/1988 |
| JP | 63-233555 | | 9/1988 |
| JP | 64-54749 | | 3/1989 |
| JP | 07-312405 | * | 11/1995 |
| JP | 08-125066 | * | 5/1996 |
| JP | 08-306853 | * | 11/1996 |
| JP | 09-8205 | * | 1/1997 |
| JP | 09-8206 | * | 1/1997 |
| JP | 09-8207 | * | 1/1997 |
| JP | 09-92775 | | 4/1997 |
| KR | 92-10286 A | | 6/1992 |
| KR | 92-10286 B | | 11/1992 |
| KR | 96-9774 A | | 3/1996 |
| KR | 96-9774 B | | 7/1996 |

*Primary Examiner*—John F. Niebling
*Assistant Examiner*—Andre' C Stevenson
(74) *Attorney, Agent, or Firm*—Jenkens & Gilchrist P.C.

(57) ABSTRACT

A method for making a packaged semiconductor having improved defect testing and increased production yield. The method includes providing a plurality of unit leadframes in a matrix, wherein each of the leadframes comprises a die pad connected to the leadframes by a plurality of tie bars, a plurality of tabs extending from each of the unit leadframes towards the respective die pad without contacting the die pad, and a plurality of dam bars provided on a boundary of the tabs. Next a semiconductor chip having a plurality of bond pads is mounted to a first surface of the die pad in each of said unit leadframes via an adhesive. The bond wires between each of the plurality of die pads are electrically connected to the respective semiconductor chip in each of the plurality of unit leadframes. Each of the unit leadframes is then encapsulated with an encapsulant. Each of the unit semiconductor packages is singulated from the matrix by cutting said dam bars between the tabs in each of the unit leadframes on two X-axes simultaneously, while leaving a connection between the tie bars and the unit leadframes intact. Then, each of the unit semiconductor packages are cut at the dam bars between the tabs on two Y-axes simultaneously, while leaving a connection between the tie bars and the unit leadframes intact. The entire matrix is next tested. Finally, the tie bars in each unit semiconductor package is cut to separate the semiconductor packages from the matrix.

20 Claims, 7 Drawing Sheets

U.S. PATENT DOCUMENTS

| | | | |
|---|---|---|---|
| 5,041,902 A | * 8/1991 | McShane | 357/79 |
| 5,157,480 A | * 10/1992 | McShane et al. | 357/74 |
| 5,172,213 A | * 12/1992 | Zimmerman | 257/796 |
| 5,172,214 A | * 12/1992 | Casto | 257/676 |
| 5,278,446 A | * 1/1994 | Nagaraj et al. | 257/707 |
| 5,428,248 A | 6/1995 | Cha | 257/676 |
| 5,521,429 A | 5/1996 | Aono et al. | 257/676 |
| 5,539,251 A | * 7/1996 | Iverson | 257/670 |
| 5,701,034 A | 12/1997 | Marrs | 257/706 |
| 5,783,861 A | 7/1998 | Son | 253/693 |
| 5,835,988 A | 11/1998 | Ishii | 257/684 |
| 5,866,939 A | 2/1999 | Shin et al. | 257/666 |
| 5,894,108 A | 4/1999 | Mostafazadeh et al. | 174/52.4 |
| 5,977,613 A | 11/1999 | Takata et al. | 257/666 |
| 5,977,630 A | 11/1999 | Woodworth et al. | 257/712 |
| 6,143,981 A | 11/2000 | Glenn | 174/52.4 |
| 6,229,200 B1 | 5/2001 | Mclellan et al. | 257/666 |
| 6,242,281 B1 | 6/2001 | Mclellan et al. | 438/106 |
| 6,294,100 B1 | 9/2001 | Fan et al. | 216/14 |
| 6,355,502 B1 | 3/2002 | Kang et al. | 438/110 |

* cited by examiner

METHOD FOR MAKING A SEMICONDUCTOR PACKAGE HAVING IMPROVED DEFECT TESTING AND INCREASED PRODUCTION YIELD

BACKGROUND OF THE INVENTION

1. Field of the Invention

The present invention relates to a method for manufacturing packaged semiconductors and, more particularly but not by way of limitation, to an improved method of manufacturing packaged semiconductors which results in increase yield and expedited package defect testing

2. History of Related Art

It is conventional in the electronic industry to encapsulate one or more semiconductor devices, such as integrated circuit dies, or chips, in a semiconductor package. These plastic packages protect a chip from environmental hazards, and provide a method of and apparatus for electrically and mechanically attaching the chip to an intended device. Recently, such semiconductor packages have included metal lead frames for supporting an integrated circuit chip which is bonded to a chip paddle region formed centrally therein. Bond wires which electrically connect pads on the integrated circuit chip to individual leads of the lead frame are then incorporated. A hard plastic encapsulating material, or encapsulant, which covers the bond wire, the integrated circuit chip and other components, forms the exterior of the package. A primary focus in this design is to provide the chip with adequate protection from the external environment in a reliable and effective manner.

As set forth above, the semiconductor package therein described incorporates a lead frame as the central supporting structure of such a package. A portion of the lead frame completely surrounded by the plastic encapsulant is internal to the package.

Portions of the lead frame extend internally from the package and are then used to connect the package externally. More information relative to lead frame technology may be found in Chapter 8 of the book *Micro Electronics Packaging Handbook,* (1989), edited by R. Tummala and E. Rymaszewski, and incorporated by reference. This book is published by Van Nostrand Reinhold, 115 Fifth Avenue, New York, N.Y.

Once the integrated circuit chips have been produced and encapsulated in semiconductor packages described above, they may be used in a wide variety of electronic appliances. The variety of electronic devices utilizing semiconductor packages has grown dramatically in recent years. These devices include cellular phones, portable computers, etc. Each of these devices typically include a motherboard on which a significant number of such semiconductor packages are secured to provide multiple electronic functions. These electronic appliances are typically manufactured in reduced sizes and at reduced costs, consumer demand increases. Accordingly, not only are semiconductor chips highly integrated, but also semiconductor packages are highly miniaturized with an increased level of package mounting density.

According to such miniaturization tendencies, semiconductor packages, which transmit electrical signals from semiconductor chips to motherboards and support the semiconductor chips on the motherboards, have been designed to have a small size. By way of example only, such semiconductor packages may have a size on the order of 1×1 mm to 10×10 mm. Examples of such semiconductor packages are referred to as MLF (micro leadframe) type semiconductor packages and MLP (micro leadframe package) type semiconductor packages. Both MLF type semiconductor packages and MLP type semiconductor packages are generally manufactured in the same manner.

During the manufacturing for a semiconductor package, electrical testing is required to insure proper function of the semiconductor package. This testing occurs after the semiconductor package has been separated from a matrix of semiconductor packages by singulation. Because of this limitation, a multitude of semiconductor packages must be individually tested. The time required to individually test these packages, in addition to the small size of the packages, results in decreased efficiency and higher costs.

SUMMARY OF THE INVENTION

In one embodiment of the present invention, there is provided a method for manufacturing semiconductor packages. First, a plurality of unit leadframes in a matrix is provided.

A substantially planar die pad is within each unit leadframe and connected to the leadframe by a plurality of tie bars. A plurality of finger-like rectangular tabs extend from the unit leadframe towards the die pad without contacting the die pad. A semiconductor chip having a plurality of bond pads is mounted on a first surface of the die pad in the unit leadframe. Dam bars are provided on the boundary of the tabs to limit flow of encapsulation material during packaging.

Next, a bond wire or equivalent conductor is connected electrically between each bond pad of the semiconductor chip and a first surface of one of the tabs.

The unit leadframes are then encapsulated by a viscous encapsulant material. The encapsulant material is then hardened. The encapsulant material covers the semiconductor chip, the bond wires, a first surface of the tabs, the first surface of the die pad, the side surfaces of the die pad and tabs, and all or part of the frames around the die pad. A lower second surface of the unit leadframe, including a lower second surface of the die pad and tabs, may optionally be covered with the encapsulant material, but may not be covered depending on the requirements of the practitioner.

The unit packages are then singulated from the matrix. The singulation step first comprises the step of cutting the dam bars and the boundary areas between the tabs in the unit leadframe on two X-axes simultaneously, while leaving the connection between the tie bars and the unit leadframe intact. Next, the dam bars and boundary areas between the tabs in the unit leadframe are cut simultaneously on two Y-axes while leaving the connection between the tie bars and the unit leadframe intact. Electrical testing is next performed on the entire matrix. Finally, the tie bars are cut to individually separate independent semiconductor packages from the leadframe matrix.

BRIEF DESCRIPTION OF THE DRAWINGS

A more complete understanding of the method and apparatus of the present invention may be obtained by reference to the following detailed description when taken in conjunction with the accompanying Drawings wherein.

DETAILED DESCRIPTION OF THE PREFERRED EMBODIMENTS

Figure 1:
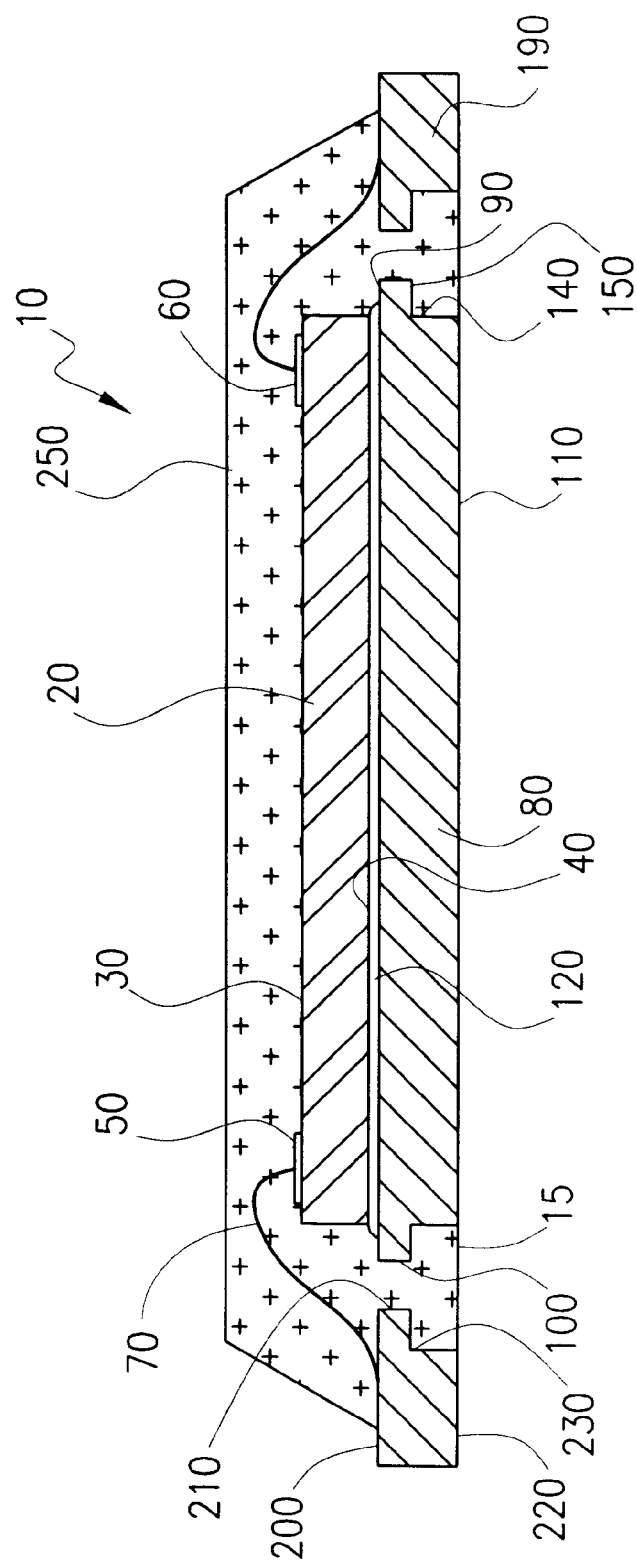
FIG. 1 is a side-elevation cross-section of a semiconductor package, which is a finished product of the method according to the present invention.
Figure 2:
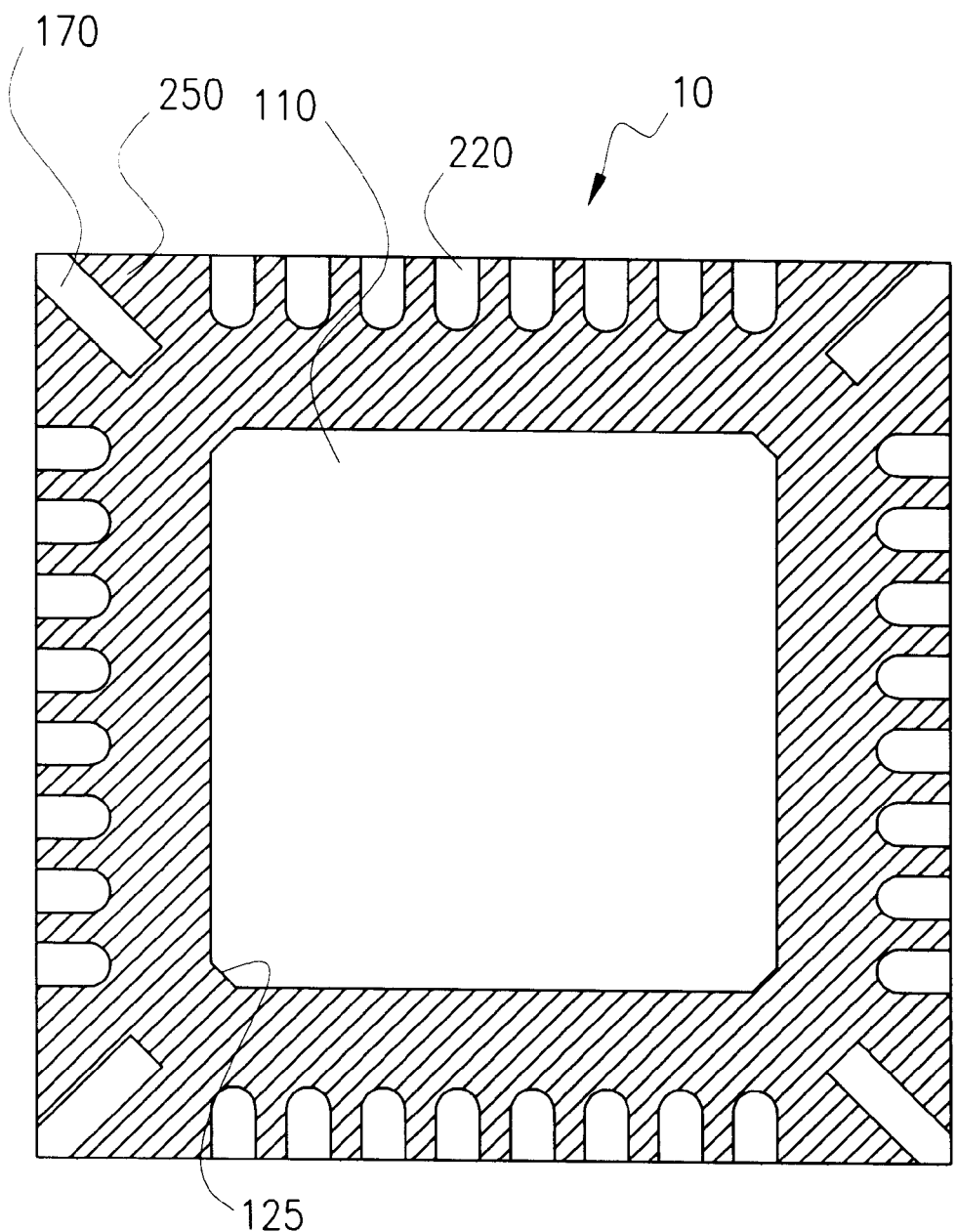
FIG. 2 is a bottom view of the semiconductor package of FIG. 1.

Referring first to FIGS. 1 and 2 in combination, there is shown a cross-section and bottom view of a completed semiconductor package 10. As shown in this figure, the semiconductor package 10 includes a bottom surface 15 and a semiconductor chip 20 having an upper surface 30 and a bottom surface 40. A plurality of input bond pads 50 and output bond pads 60 are disposed on the upper surface 30 of the semiconductor chip 20. Conductive wires 70, including but not limited to gold or aluminum wires, electrically connect the input bond pads 60 and output bond pads 70 to tabs 190.

A die pad or chip paddle 80 has a top surface 90, a side surface 100 and a bottom surface 110, and is secured to the bottom surface 40 of the semiconductor chip 20 via an adhesive 120. The chip paddle 80 has corners 125, a circumference 130 and may include a half-etched section 140. The half-etched section 140 is located at a lower edge 150 of the chip paddle 80.

Figure 3:
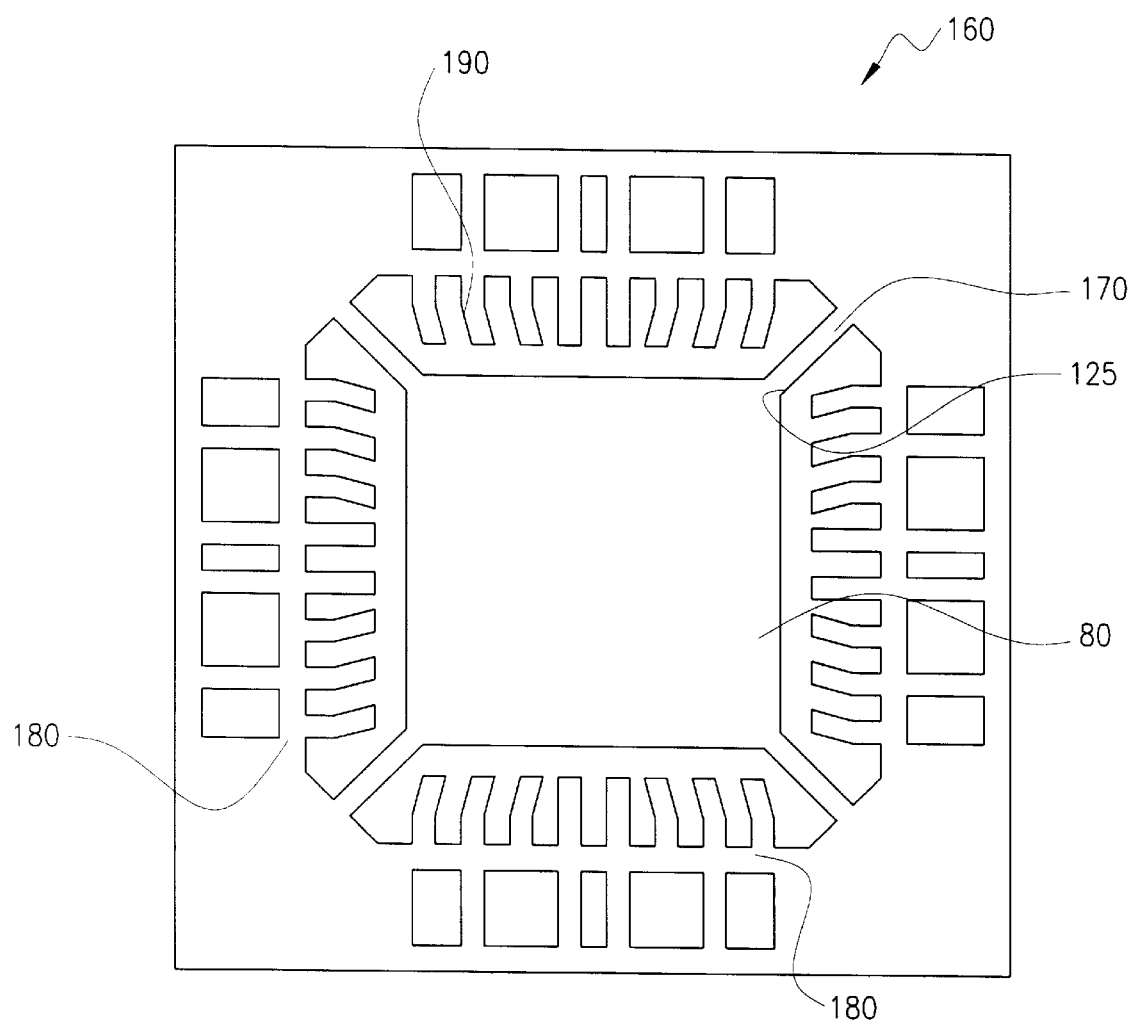
FIG. 3 is a top plan view of a unit leadframe, which may be used in accordance with the method of the present invention.

Referring now to FIG. 3, a leadframe 160 is shown having a plurality of tie bars 170. These tie bars 170 are connected to the corners 125 of the chip paddle 80 and support the chip paddle 80. The tie bars 170 outwardly extend from the chip paddle 80.

The leadframe 160 also includes a plurality of dam bars 180, which are cut during the singulation process.

A plurality of finger-like tabs 190 are connected to the leadframe 160 and have an upper surface 200, a side surface 210 and a bottom surface 220 (FIG. 2). The tabs 190 are radially formed at regular intervals along the semiconductor chip 20 and spaced apart from the semiconductor chip 20. The tabs 190 extend towards the chip 20 and have a half-etched section 230 facing the chip 20.

Figure 4:
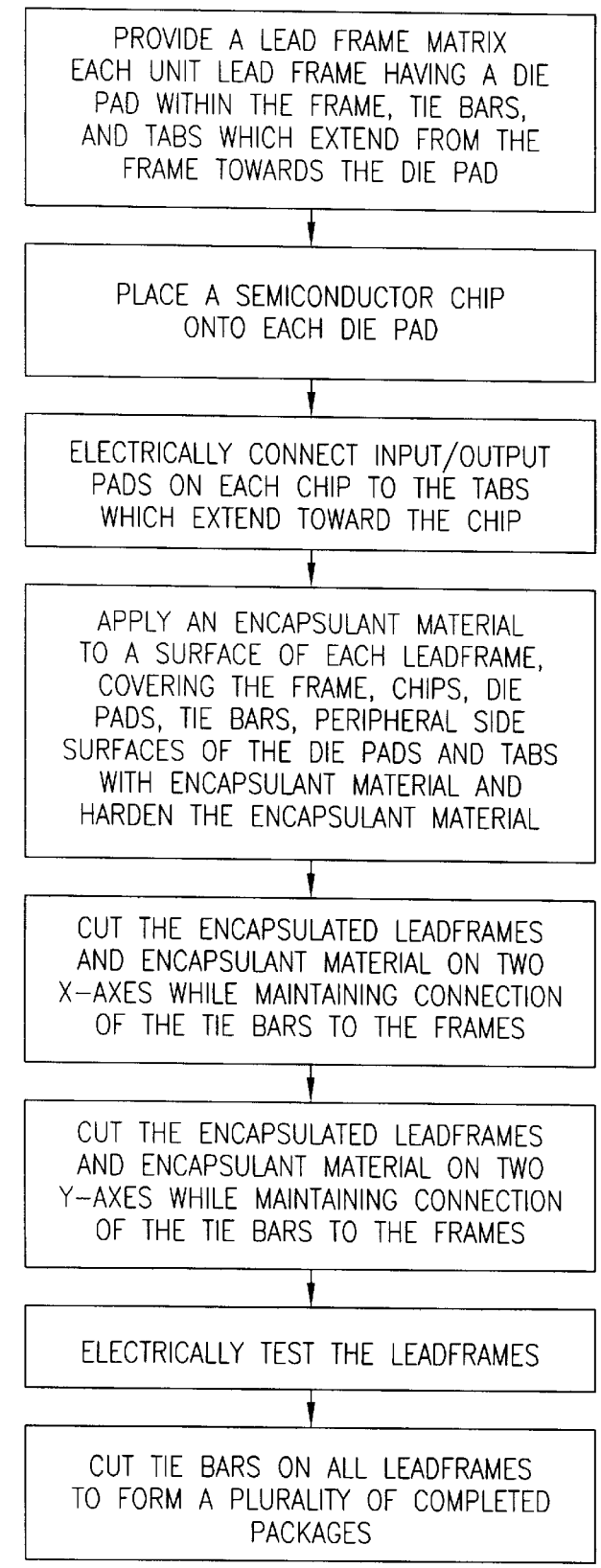
FIG. 4 is a flow chart of a method of making a package according to the principles of the present invention.

Referring now to FIG. 4, there is shown a flow chart for an assembly method in accordance with the present invention, for constructing a package like that of FIG. 1.

Figure 5A:
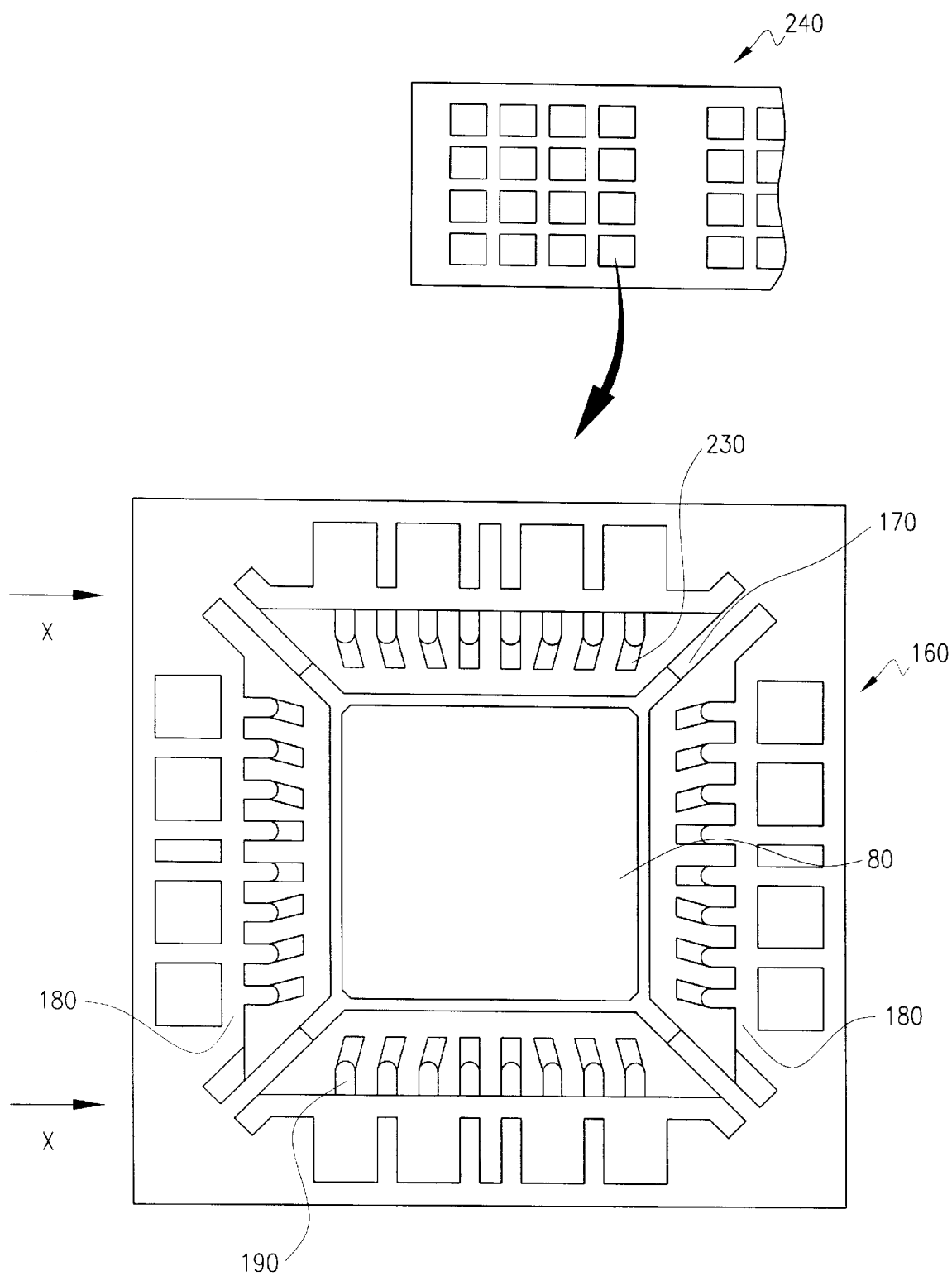
FIGS. 5A and 5B are bottom views of the matrix and unit leadframe, showing a singulation process according to the principles of the present invention.

Step 1 of FIG. 4, shown in FIG. 5A, provides a matrix 240 of unit leadframes 160. The substantially planar or substantially planar chip paddle 80 is within each unit leadframe 160 and connected to the leadframe 160 by the plurality of tie bars 170. A plurality of finger-like rectangular tabs 190 extend from the unit leadframe 160 towards the die pad 80 without contacting the die pad 80. Although not shown in FIG. 5A, but illustrates in cross-section in FIG. 1, a semiconductor chip 20 having a plurality of bond pads 60, 70 is mounted on the upper surface 30 of the die pad 80 in the unit leadframe 160. Dam bars 180 (FIG. 3) are provided on the boundary of the tabs 190 to limit flow of encapsulation material 240 during packaging.

Step 3 of FIG. 4 comprises a bond wire 70 or equivalent conductor connected electrically between each input bond and output bond pad 50, 60 of the semiconductor chip 20 and a first surface 200 of one of the tabs 190. First surface 200 may be electroplated with an electrical conductivity enhancing material such as, but not limited to, gold or silver.

Step 4 of FIG. 4 comprises the unit leadframes 160 encapsulated by a viscous encapsulant material 250. Encapsulation material 250 may be, for example, thermoplastics or thermoset resins, with thermoset resins including silicones, phenolics, and epoxies. The encapsulant material 250 is then hardened. The encapsulant material 250 covers the semiconductor chip 20, the bond wires 70, a first surface 200 of the tabs 190, the upper surface 30 of the die pad 80, the side surfaces of the die pad and tabs (not shown), and all or part of the leadframe 160 around the die pad 80. Although not shown in FIG. 3, a lower second surface 175 of the unit leadframe 160, including a lower second surface 85 of the die pad 80 and tabs 190, may optionally be covered with the encapsulant material, but may not be covered depending on the requirements of the practitioner. If the lower second surface 175 is not covered, it may optionally be plated with a corrosion-minimizing material such as, for example, tin lead, tin, gold, nickel palladium, tin bismuth, or similar materials known in the art.

Figure 5B:
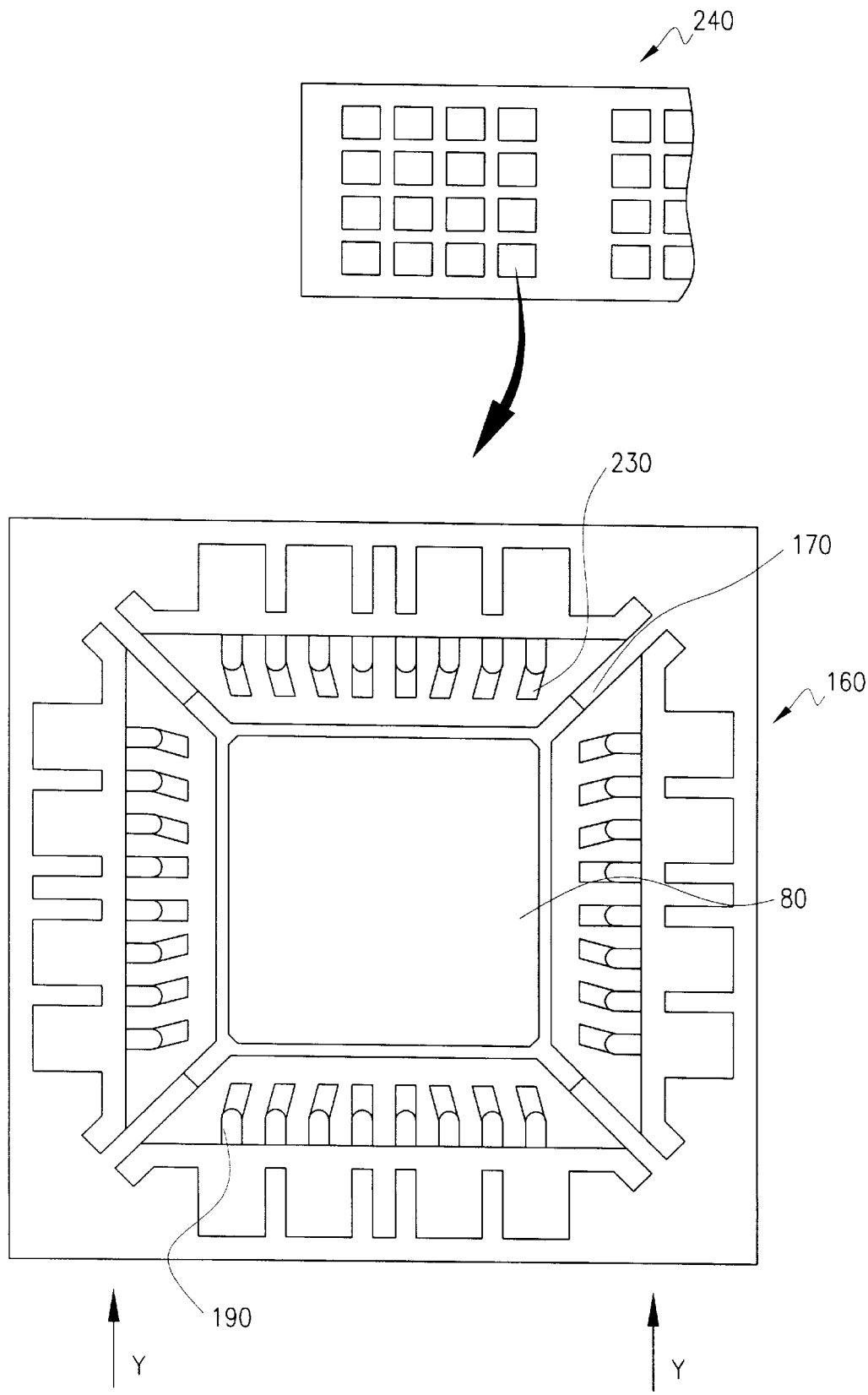

Step 5 of FIG. 4 comprises the singulation step of the unit packages 10 from the matrix 240. The singulation step comprises the first step of cutting the dam bars 180 and the boundary areas between the tabs 190 in the unit leadframe 160 on two X-axes simultaneously, while leaving the connection between the tie bars 170 and the unit leadframe 160 intact. Referring now to FIG. 5B, the dam bars 180 and boundary areas between the tabs 190 in the unit leadframe 160 are cut simultaneously on two Y-axes while leaving the connection between the tie bars 170 and the unit leadframe 170 intact.

Figure 6:
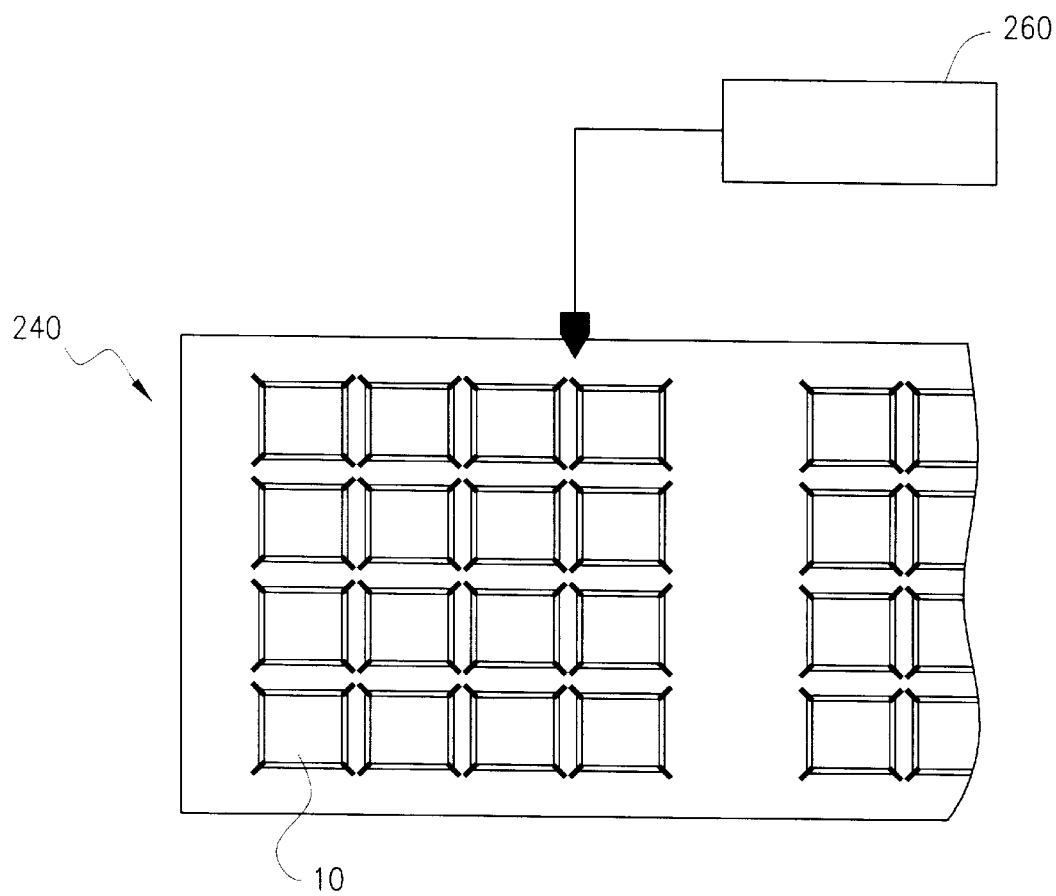
FIG. 6 is a bottom view showing a semiconductor package defect testing process according to the principles of the present invention.

In Step 7 and FIG. 6, electrical testing is next performed by a tester 260 on the entire matrix 240. The connection between the tie bars 170 and the package 10 allows each individual unit leadframe 160 on the matrix 240 to be tested. After testing, in Step 8 the tie bars 170 are cut to individually separate independent semiconductor packages 10 from the leadframe matrix 240.

The overall method thus takes less time than typical methods of making semiconductor packages, largely due to the decreased time for electrically testing the current package 10. Due to this method of the present invention, the testing of the matrices 240 produces higher quality, lower defect semiconductor packages 10.

The following applications are all being filed on the same date as the present application and all are incorporated by reference as if wholly rewritten entirely herein, including any additional matter incorporated by reference therein:

| Application Number | Title of Application | First Named Inventor |
| --- | --- | --- |
| 09/687,787 | Thin and Heat Radiant Semiconductor Package and Method for Manufacturing | Jae Hun Ku |
| 09/687,331 | Leadframe for Semiconductor Package and Mold for Molding the Same | Young Suk Chung |
| 09/687,876 | Near Chip Size Semiconductor Package | Sean Timothy Crowley |
| 09/687,536 | End Grid Array Semiconductor Package | Jae Hun Ku |
| 09/687,048 | Leadframe and Semiconductor Package with Improved Solder Joint Strength | Tae Heon Lee |
| 09/687,585 | Semiconductor Package Having Reduced Thickness | Tae Heon Lee |

-continued

| Application Number | Title of Application | First Named Inventor |
|---|---|---|
| 09/687,541 | Semiconductor Package Leadframe Assembly and Method of Manufacture | Young Suk Chung |
| 09/687,049 | Method for Making Semiconductor Packages | Young Suk Chung |

It is thus believed that the operation and construction of the present invention will be apparent from the foregoing description of the preferred exemplary embodiments. It will be obvious to a person of ordinary skill in the art that various changes and modifications may be made herein without departing from the spirit and the scope of the invention.

What is claimed is:

1. A method of making a packaged semiconductor, comprising:
    providing a plurality of unit leadframes in a matrix, each of said leadframes comprising a die pad connected to said leadframes by a plurality of tie bars, a plurality of tabs extending from each of said unit leadframes towards the respective said die pad without contacting said die pad, and a plurality of dam bars provided on a boundary of said tabs;
    mounting a semiconductor chip having a plurality of bond pads to a first surface of said die pad in each of said unit leadframes;
    electrically connecting a bond wire between each of said plurality of die pads to the respective said semiconductor chip in each of said plurality of unit leadframes;
    encapsulating each of said unit leadframes to form unit semiconductor packages;
    singulating each of said unit semiconductor packages from said matrix by cutting said dam bars between said tabs in each of said unit leadframes on two X-axes simultaneously while leaving a connection between said tie bars and said unit leadframes intact, cutting said dam bars between said tabs in each of said unit leadframes on two Y-axes simultaneously while leaving a connection between said tie bars and said unit leadframes intact; and
    electrically testing said matrix.

2. The method of making a packaged semiconductor of claim 1, further comprising the step of:
    cutting said tie bars to completely separate said packages from said matrix.

3. The method of making a packaged semiconductor of claim 1, wherein said step of encapsulating each of said unit leadframes comprises covering with encapsulant part of said plurality of unit leadframes around a respective said die pad.

4. The method of making a packaged semiconductor of claim 1, wherein each of said steps occur sequentially.

5. The method of making a packaged semiconductor of claim 1, further comprising the step of hardening the encapsulation material after said step of encapsulating each of said unit leadframes.

6. The method of making a packaged semiconductor of claim 1, wherein a lower second surface of a respective die pad is covered with encapsulating material during said step of encapsulating each of said unit leadframes.

7. The method of making a packaged semiconductor of claim 6, further comprising plating a lower second surface of a respective on of said plurality of unit leadframes.

8. The method of making a packaged semiconductor of claim 7, wherein said plating is a corrosion-minimizing material.

9. The method of making a packaged semiconductor of claim 1, wherein said step of electrically testing said matrix comprises electrically testing respective ones of said plurality of unit leadframes.

10. The method of making a packaged semiconductor of claim 1, wherein said plurality of tabs are radially formed at approximately regular intervals about at least one semiconductor chip.

11. The method of making a packaged semiconductor of claim 1, wherein at least one of said plurality of tabs has a half-etched section facing said semiconductor chip.

12. The method of making a packaged semiconductor of claim 1, wherein said step of singulating each of said unit semiconductor packages from said matrix is accomplished by punching said dam bars between said tabs in each of said unit leadframes on two X-axes simultaneously while leaving a connection between said tie bars and said unit leadframes intact, cutting said dam bars between said tabs in each of said unit leadframes on two Y-axes simultaneously while leaving a connection between said tie bars and said unit leadframes intact.

13. The method of making a packaged semiconductor of claim 1, wherein said step of encapsulating each of said unit leadframes comprises encapsulating said unit leadframes with thermoplastics.

14. The method of making a packaged semiconductor of claim 1, wherein said step of encapsulating each of said unit leadframes comprises encapsulating said unit leadframes with thermoset resins.

15. The method of making a packaged semiconductor of claim 14, wherein the thermoset resins are selected from a group consisting of: silicones, phenolics and epoxies.

16. The method of making a packaged semiconductor of claim 1, wherein said step of encapsulating comprises covering the respective semiconductor chip, the respectivebond wires, a first surface and side surfaces of the tabs, the upper surface of the die pad, the side surfaces of the die pad, and a portion of the unit leadframe around the respective die pad with a viscous encapsulant material.

17. The method of making a packaged semiconductor of claim 1, wherein said step of electrically testing said matrix comprises electrically testing a portion of said matrix.

18. The method of making a packaged semiconductor of claim 1, wherein the bond wires are conductive.

19. A method of making a packaged semiconductor, comprising:
    means for providing a plurality of unit leadframes in a matrix;
    means for mounting a semiconductor chip having a plurality of bond pads to a die pad in each of said plurality of unit leadframes;
    means for electrically connecting a bond wire between the die pads to the respective said semiconductor chip in each of said plurality of unit leadframes;
    means for encapsulating each of said unit leadframes to form unit semiconductor packages;
    means for singulating each of said unit semiconductor packages from said matrix by singulating dam bars on each of said plurality of unit leadframes between tabs in each of said unit leadframes on two X-axes simultaneously while leaving a connection between tie bars the plurality of unit leadframes and the unit leadframes intact, singulating said dam bars between the tabs in each of said unit leadframes on two Y-axes simultaneously while leaving a connection between the tie bars and the unit leadframes intact; and means for electrically testing said matrix.

20. A method of making a packaged semiconductor, comprising:

providing unit leadframes in a matrix, the unit leadframes each comprising a die pad connected to the unit leadframes by at least one tie bar, a plurality of tabs extending from each of the unit leadframes towards the respective die pad, and a plurality of dam bars provided on a boundary of said tabs;

mounting a semiconductor chip to a respective die pad in each of said unit leadframes;

electrically connecting the die pads to the respective semiconductor chip;

encapsulating the unit leadframes to form unit semiconductor packages;

singulating each of said unit semiconductor packages from said matrix by singulating the dam bars between the tabs in the unit leadframes on two X-axes simultaneously while leaving a connection between the at least one tie bar and the unit leadframes intact, singulating the dam bars between the tabs in the unit leadframes on two Y-axes simultaneously while leaving a connection between the at least one tie bar and the unit leadframes intact; and electrically testing said matrix.

* * * * *